United States Patent
Yair et al.

(10) Patent No.: US 6,900,638 B1
(45) Date of Patent: May 31, 2005

(54) SWITCHING DEVICE TO LINEARLY CONDUCT A CURRENT BETWEEN A GRADIENT AMPLIFIER AND A GRADIENT COIL ASSEMBLY OF AN MRI SYSTEM

(75) Inventors: Raphael Yair, Haifa (IL); Zvi Shamir Haruzim (IL)

(73) Assignee: GE Medical Technology Services, Inc., Waukesha, WI (US)

(*) Notice: Subject to any disclaimer, the term of this patent is extended or adjusted under 35 U.S.C. 154(b) by 0 days.

(21) Appl. No.: 09/541,354

(22) Filed: Mar. 31, 2000

(51) Int. Cl.[7] ............................................. G01V 3/00
(52) U.S. Cl. .................. 324/322; 324/318; 324/309
(58) Field of Search .............................. 324/322, 318, 324/307, 309, 312, 306, 300; 330/10; 361/20, 100; 307/417; 318/138; 327/461

(56) References Cited

U.S. PATENT DOCUMENTS

| | | | | |
|---|---|---|---|---|
| 3,019,355 A | * | 1/1962 | Evan | 307/417 |
| 3,629,613 A | * | 12/1971 | Feige | 327/461 |
| 3,697,839 A | * | 10/1972 | Unnewehr | 318/138 |
| 4,047,235 A | * | 9/1977 | Davis | 361/100 |
| 4,820,986 A | * | 4/1989 | Mansfield et al. | 324/322 |
| 5,270,657 A | * | 12/1993 | Wirth et al. | 324/322 |
| 5,311,135 A | * | 5/1994 | Vavrek et al. | 324/318 |
| 5,521,507 A | * | 5/1996 | Rohan et al. | 324/322 |
| 5,528,444 A | * | 6/1996 | Cooke et al. | 361/20 |
| 5,684,402 A | * | 11/1997 | Rohan et al. | 324/322 |
| 5,835,995 A | * | 11/1998 | Macovski et al. | 324/309 |
| 6,028,476 A | * | 2/2000 | Schweighofer | 330/10 |
| 6,031,422 A | * | 2/2000 | Ideler | 324/322 |
| 6,034,565 A | * | 3/2000 | Schweighofer | 330/10 |
| 6,140,873 A | * | 10/2000 | Van Groningen | 330/10 |
| 6,144,205 A | * | 11/2000 | Souza et al. | 324/322 |
| 6,163,201 A | * | 12/2000 | Schweighofer | 327/496 |

FOREIGN PATENT DOCUMENTS

| | | | | |
|---|---|---|---|---|
| JP | 10-080413 | 3/1998 | | H02M/7/48 |
| JP | 10-179540 | 7/1998 | | G01R/33/385 |

* cited by examiner

Primary Examiner—Christopher W. Fulton
Assistant Examiner—Tiffany A. Fetzner
(74) Attorney, Agent, or Firm—Fletcher Yoder

(57) ABSTRACT

A switching circuit configured to substantially linearly conduct current between a source and a load includes a switching device and a steering circuit. The switching device has a conductive state in which a first portion of the current flows between the source and the load, the conductive state being dependent on the magnitude of the current. The steering circuit has a conductive state in which a second portion of the current flows, such that substantially the entire current is conducted between the source and the load. The switching circuit is particularly suited for use in a magnetic resonance imaging system to conduct gradient current between the gradient amplifiers and the gradient coils.

18 Claims, 7 Drawing Sheets

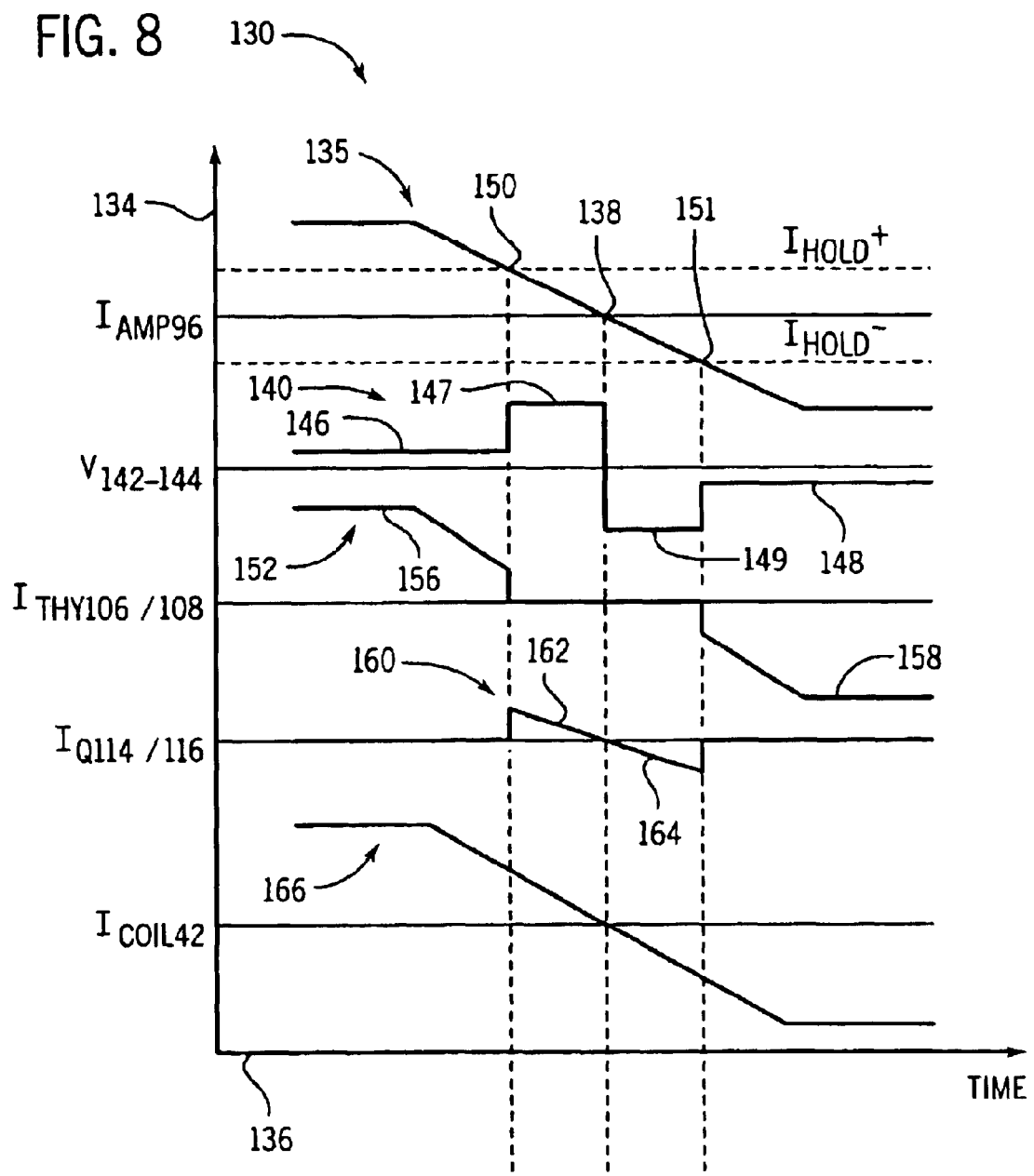

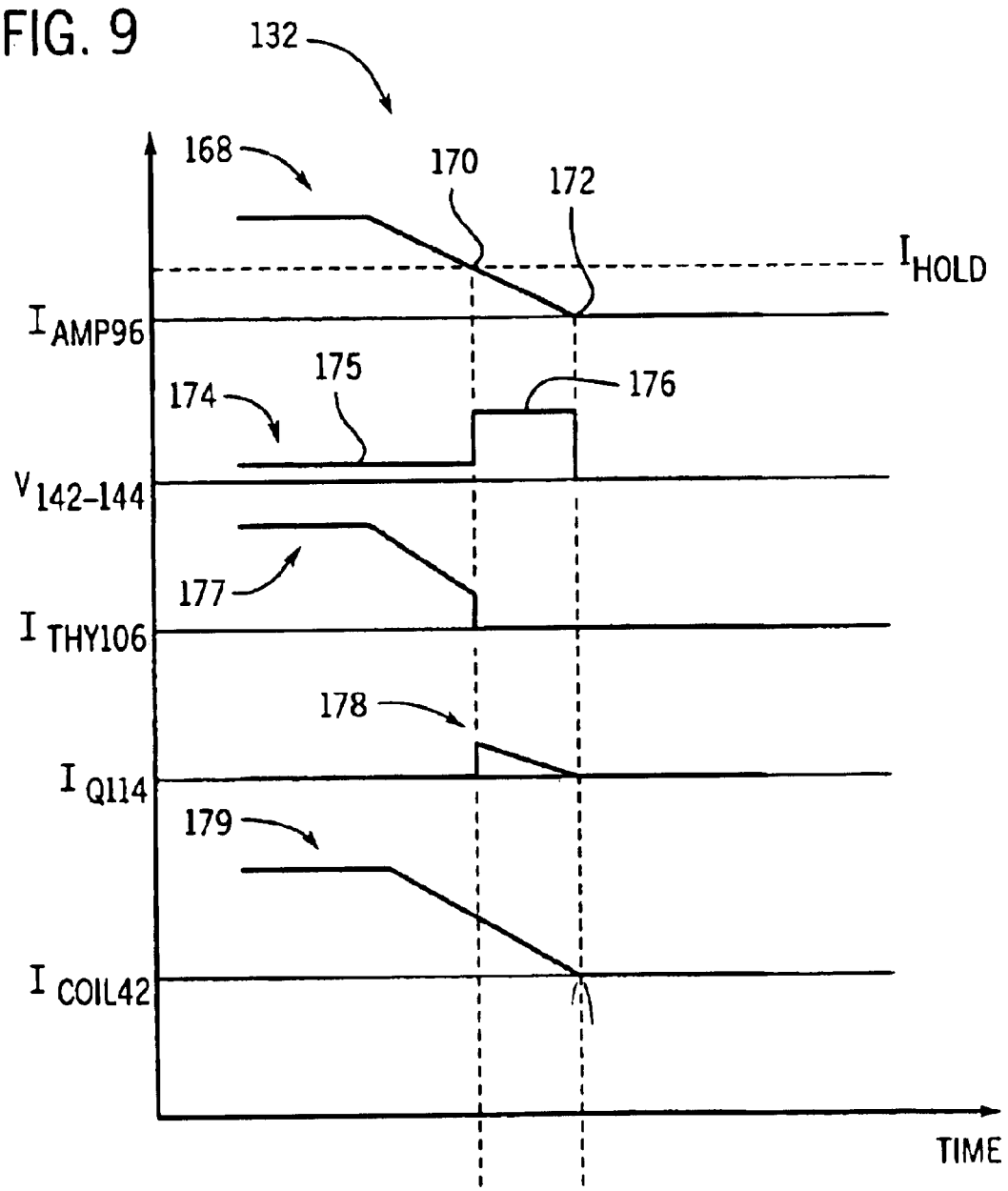

SWITCHING DEVICE TO LINEARLY CONDUCT A CURRENT BETWEEN A GRADIENT AMPLIFIER AND A GRADIENT COIL ASSEMBLY OF AN MRI SYSTEM

FIELD OF THE INVENTION

The present invention relates generally to an electronic power switch configured to conduct a load current in a continuous, or linear, manner about and through a zero crossing, and, more particularly, to a magnetic resonance imaging system having an electronic power switch coupled between a gradient amplifier and a gradient coil assembly, the electronic power switch being configured to conduct the gradient coil current in a continuous manner.

BACKGROUND OF THE INVENTION

Many power applications require precise switching and linear conduction of currents between a source and a load to ensure adequate performance. Such applications include drive circuitry for electrical motors or lamps and medical imaging systems, such as a magnetic resonance imaging (MRI) system. In MRI systems, MRI data can be detrimentally affected if a scan is not precisely controlled. In general, in an MRI system, an MRI scan is performed in accordance with an imaging protocol which includes one or more predefined pulse sequences. A pulse sequence defines the manner in which gradient magnetic fields are generated in the scanning device, which, in turn, govern parameters of the scan, such as slice orientation, frequency encoding and phase encoding. Failure to precisely control the generation of the gradient fields results in poor imaging data that may exhibit, for example, geometric distortion or poor spatial resolution.

In an MRI scanner, a primary magnetic field, B0, typically is produced by a superconducting electromagnet. Gradient magnetic fields are produced in B0 by a gradient coil assembly which typically includes three pairs of coils. Typically, the first pair of coils is configured to generate a gradient in the magnetic field along the physical x-axis of the scanner. Similarly, the second and third pairs of coils are configured to generate gradients in the magnetic field along the physical y-axis and z-axis of the scanner, respectively.

MRI scanners may offer improved imaging performance and image resolution by incorporating twin gradient coil sets that include a "whole body" coil set for generating "coarse" MRI data during a scan and a smaller, "supplemental" coil set for generating "fine" MRI data. Each of the twin gradient coils sets includes an x-axis coil pair, a y-axis coil pair, and a z-axis coil pair. Both coil sets contribute to the MRI data measurements; however, only one coil set is energized at a time. Thus, to improve imaging performance and image resolution, the whole body coil set is energized to perform a first scan in accordance with a predefined pulse sequence, and then the supplemental coil set is energized to perform a second scan. The coil sets may be alternately energized for further scans as may be required for the particular imaging application.

Switching between the coil sets may be performed in a variety of manners. For example, a switch may be coupled, between a source that provides the power to energize the coils. The switch may be manually manipulated (e.g., mechanically or electrically), which can be inconvenient and slow, or may be automatically manipulated (e.g., via a software control program). Further, the switch may be a mechanical switch (e.g., a contactor) or an electronic switch (e.g., a transistor, diode, etc.). However, regardless of the method of manipulation or the type of switch used, well-controlled, high performance MR imaging requires that the gradient coils be driven in accordance with the predefined pulse sequence in a continuous, strong and reproducible manner. Thus, for example, the switch must be capable of conducting high amplitude gradient currents that transition between positive and negative values, as well as between a positive or negative value and a zero (or very low amplitude) value. That is, to ensure MR imaging performance, the switch ideally should exhibit a linear, or uninterrupted, conductive state throughout all portions of the pulse sequence during which the gradient current flows.

One type of linear switch is a mechanical contactor that can be switched between conductive and non-conductive states by, for example, either a manual or automatic remote command. Because the contactor conducts current linearly in both directions, no special measures or circuitry is required to ensure proper steering of the load current between the gradient coil assembly and the gradient coil drive circuitry. Contactors, however, are large, acoustically noisy, and sensitive to the magnetic field generated by the scanner. Thus, the use of contactors can present complexities in the physical mounting, shielding and pack aging of the contactors and other associated components. Further, the switching speed of a contactor between conductive and non-conductive states is slow, e.g., typically 5–15 milliseconds. Moreover, switching a contactor often causes arcing which can reduce the contactor's useful life though arcing can be controlled through appropriate protection circuitry or via mechanical structures, such control introduces additional complexities, which can translate to additional costs and decreased reliability. As a result a mechanical switch (e.g., a contactor) may not be the optimal choice.

Other alternatives include electronic switches, such as a transistor, a diode, a thyristor, etc. Electronic switches, however, may not be characterized by a linear conductive state. That is, the conductive characteristics of an electronic switch may be dependent on the magnitude of th e current flow through the switch. Thus, to ensure linearity in the conduction of current between the load (e.g. gradient coils) and the drive circuitry, additional circuitry may be required to maintain linear current flow during periods in which the current transitions between positive and negative values, and/or as the current transitions from a positive or negative value to a substantially no-current flow condition.

An exemplary topology of an electronic switch includes a transistor coupled with a diode bridge. In this topology, the diodes in the bridge steer the current between positive and negative values and/or to a near-zero current flow condition. However, when such a topology is used in an application that requires high levels of current flow, both the transistor an d the diode bridge must be power components, thus consuming a significant amount of packaging space. Further, because the current at any time must flow through a transistor junction and/or two diode junctions, a significant amount of energy is dissipated in the components, requiring a complex heat sink scheme, such as a water-cooled mounting plate, fans, fins, etc. Thus, such a transistor/diode bridge topology may not be the optimal choice for power applications.

Accordingly, there is a need for a switching assembly to selectively couple a source (e.g., a gradient amplifier) to a load (e.g., a gradient coil assembly). Such a switching assembly would include a switching device having a conductive state in which a current is conducted in an uninterrupted, or continuous, manner between the source and the load. Further, such a switching assembly should dissipate a minimum amount of heat, have a minimum number of components, switch quickly, quietly and reliably, be relatively immune to the effects of a magnetic field, and generate a limited amount of electromagnetic interference.

SUMMARY OF THE INVENTION

The present invention addresses one or more of the shortcomings noted above.

For example, one aspect of the present technique features a switching circuit for linearly conducting current between a source and a load. The switching circuit includes a switching device and a current steering circuit, both of which are coupled between the source and the load. The switching device has a conductive state in which a first portion of the current is conducted between the source and the load during a first phase of operation that is dependent on the magnitude of the current. In a second phase of operation, the current steering circuit conducts the current between the source and the load during a second portion of the current.

In another aspect of the invention, a magnetic resonance imaging (MRI) system is provided which performs an MRI scan in accordance with a pulse sequence that includes at least a first pulse. The MRI system includes a gradient coil assembly to generate a gradient magnetic field during the MRI scan, an amplifier to drive the gradient coil assembly to generate the gradient magnetic field in accordance with the pulse sequence, and a switch assembly to provide a conductive path between the amplifier and the gradient coil assembly. The switch assembly includes a first switching device and a second switching device coupled in parallel with the first switching device. The first switching device has a conductive state during a first portion of the first pulse of the pulse sequence, and the second switching device has a conductive state during a second portion of the first pulse such that a conductive path is provided between the amplifier and the gradient coil assembly during substantially the entire duration of the first pulse.

In another aspect of the technique, a method for performing an MRI scan in accordance with a pulse sequence includes receiving a pulse sequence and generating a current to drive the gradient coil assembly in accordance with the pulse sequence, the current comprising a plurality of current pulses. The method further includes conducting the current to the gradient coil assembly through a switch assembly which includes first and second switching devices that are coupled in parallel. The first switching device is placed in a conductive state during a first portion of a first current pulse of the pulse sequence, and the second switching device is placed in a conductive state during a second portion of the first current pulse, such that the current is conducted to the gradient coil assembly during substantially the entire duration of the first current pulse.

BRIEF DESCRIPTION OF THE DRAWINGS

FIG. 8 is a graphical representation of the current and voltage measured at various points in the switch assembly of FIG. 6 during the transition of the gradient current of FIG. 7 from a positive magnitude to a negative magnitude; and FIG. 9 is a graphical representation of the current and voltage measured at the various points in the switch assembly of FIG. 6 during the transition of the gradient current of FIG. 7 from a positive magnitude to a substantially zero magnitude.

DETAILED DESCRIPTION OF THE INVENTION

Figure 1:
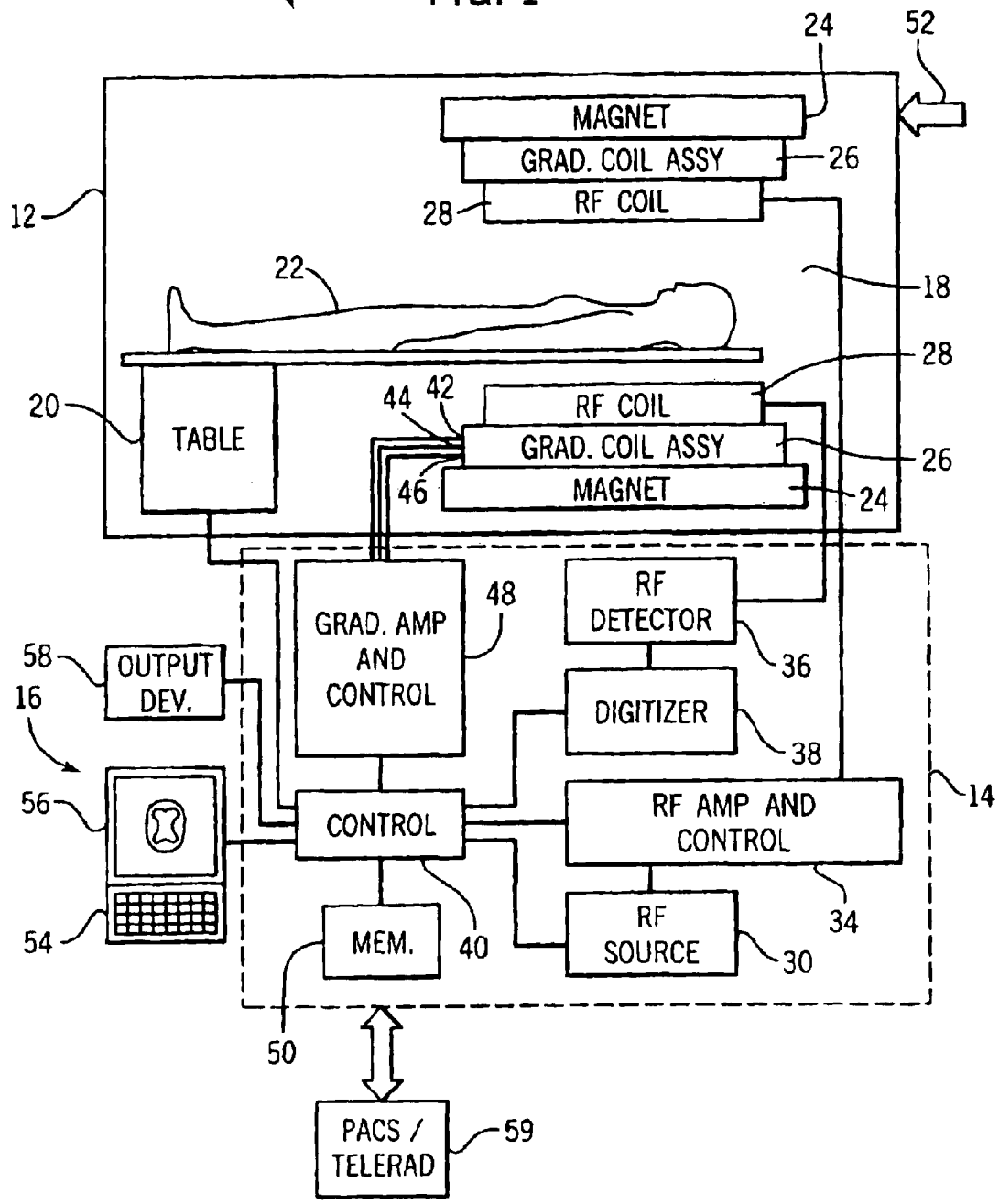
FIG. 1 is a diagrammatical representation of an MRI system for use in medical diagnostic imaging and implementing certain aspects of the present technique.

Turning now to the drawings and referring first to FIG. 1, a magnetic resonance imaging (MRI) system 10 is illustrated diagrammatically as including a scanner 12, scanner control circuitry 14, and a user interface 16. While MRI system 10 may include any suitable MRI scanner or detector, in the illustrated embodiment, system 10 includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a plurality of associated magnetic coils for producing controlled magnetic fields, for generating radio frequency excitation pulses, and for detecting emissions from gyromagnetic material within the patient in response to such pulses. In the diagrammatical view of FIG. 1, a primary magnet coil 24 is provided for generating a primary magnetic field, B0, generally aligned with patient bore 18. A gradient coil assembly 26 includes a plurality of gradient coils for generating controlled magnetic gradient fields (e.g., Bx, By, and Bz) during examination sequences as described more fully below. A radio frequency coil 28 is provided for generating radio frequency pulses for exciting the gyromagnetic material. In the embodiment illustrated in FIG. 1, RF coil 28 also serves as a receiving coil. Thus, RF coil 28 is coupled with driving and receiving circuitry in passive and active modes for receiving emissions from the gyromagnetic material and for outputting radio frequency excitation pulses, respectively. For example, in the embodiment illustrated in FIG. 1, the driving and receiving circuitry includes an RF source 30, which produces an RF signal of a desired frequency; an RF amplifier and control circuit 34, which shapes the RF signal into pulses and amplifies the power of the RF pulses; an RF detector 36, which detects the image signals; and a digitizer 38, which digitizes the image signals to allow for further processing to reconstruct the image. Alternatively, various configurations of receiving coils may be provided separate from RF coil 28. Such coils may include structures specifically adapted for target anatomies, such as head coil assemblies, and so forth. Moreover, receiving coils may be provided in any suitable physical configuration, including phased array coils, and so forth.

The coils of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field B0, individual magnetic moments of the paramagnetic nuclei in the tissue attempt to align with the B0 field, but precess in a random order at their Larmor frequency. While a net magnetic moment is produced in the direction of the polarizing field, the randomly oriented components of the moment in a perpendicular place generally cancel one another. During an examination sequence, an RF frequency pulse is generated at or near the Larmor frequency of the material of interest, resulting in rotation of the net aligned moment to produce a net transverse magnetic moment. Radio signals are emitted from the patient following the termination of the excitation signals. This magnetic resonance signal is detected in the scanner and processed for reconstruction of the desired image.

The gradient coil assembly 26 includes gradient coils 42, 44, and 46, which serve to generate precisely controlled magnetic fields, the strength of which vary over a predefined field of view, typically with positive and negative polarity. The gradient fields created by the gradient coils generally coincide with the physical axes of the patient 22. Accordingly, gradient coil 42 may generate a gradient Gx along the patient's x-axis (i.e., left to right); gradient coil 44 may generate a gradient Gy along the patient's y-axis (i.e., anterior to posterior); and gradient coil 42 may generate a gradient Gz along the patient's z-axis (i.e., superior to inferior). When each coil is energized with known electric current, the resulting magnetic field gradient is superimposed over the primary field B0 and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes (i.e., x, y, and z), as well as by logical axes. In the physical sense, the fields are mutually orthogonally oriented to form an x,y,z coordinate system which can be rotated by appropriate manipulation of the pulsed current applied to the individual gradient coils. In a logical sense, the coordinate system defines gradients which are typically referred to as slice select gradients, frequency encoding gradients, and phase encoding gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encoding to excite the desired material and to acquire resulting MR signals for processing.

The coils of scanner 12 are controlled by system control circuitry 14 to generate the desired magnetic field and radio frequency pulses. In the diagrammatical view of FIG. 1, control circuitry 14 thus includes control circuit 40 for commanding the pulse sequences employed during the examinations and for processing received signals. Control circuit 40 may include any suitable programmable logic device, such as a CPU or digital signal processor of a general purpose or application-specific computer. The pulse sequences and control instructions or program may be stored in memory circuitry 50, which may be any suitable memory device, such as volatile and non-volatile memory devices.

The interface between the control circuitry 14 is managed by gradient amplification and control circuitry 48, RF amplification and control circuitry 34, and RF detector circuitry 36. Gradient amplification and control circuitry 48 includes amplifiers for each gradient field coil to supply drive current to the field coils in response to control signals from control circuit 40, as will be described in further detail below. RF amplification and control circuitry 34 includes amplification circuitry for driving RF coil 28. In embodiments in which the RF coil serves both to emit the RF excitation pulse and to receive the MR signals, RF circuitry 34 will typically include a switching device for toggling the RF coil between active (or transmitting) mode and passive (or receiving) mode. A power supply, denoted generally by reference numeral 52 in FIG. 1, is provided for energizing the primary magnet 24. Control circuitry 14 also includes a digitizer 38 for digitizing the image signals detected by RF detector 36 for further processing by control circuit 40.

System control circuitry 14 may include a wide range of devices for facilitating interface between an operator or radiologist and scanner 12. In the illustrated embodiment, for example, user interface 16 is provided in the form of a computer workstation employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 54, an alternative input device such as a mouse, a monitor 56 for viewing data and acquired images and facilitating operator interface, and an output device 58, such as a printer for generating hard copy output of documents and images reconstructed from acquired data In addition, system 10 may include various local and remote image access and examination control devices, represented generally by the reference numeral 59 in FIG. 1. Such devices may include picture archiving and communication systems, teleradiology systems, and the like.

Figure 2:
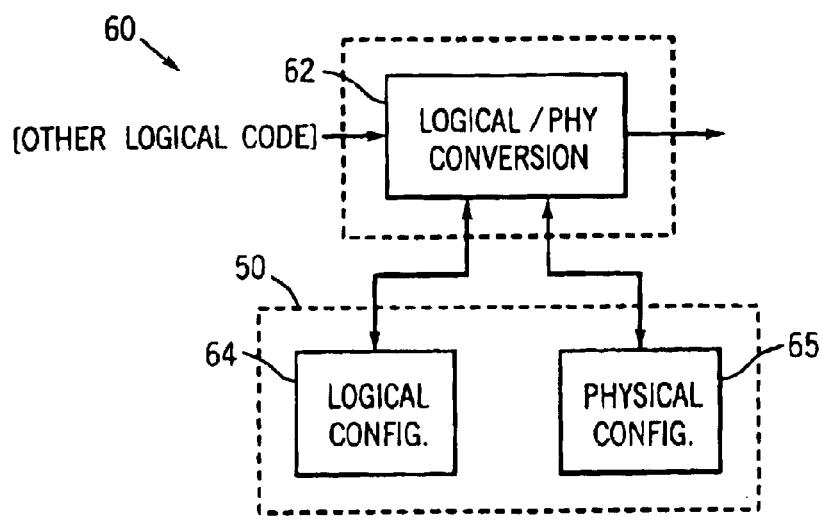
FIG. 2 is a block diagram of functional components of a pulse sequence description module in a controller for a system of the type illustrated in FIG. 1.

In general, the pulse sequences implemented in the MRI system will be defined by both logical and physical configuration sets and parameter settings stored within control circuitry 14. FIG. 2 represents, diagrammatically, relationships between functional components of control circuitry 14 and configuration components stored in memory circuitry 50. The functional components facilitate coordination of the pulse sequences to accommodate preestablished settings for both logical and physical axes of the system. In general, the axis control modules, denoted collectively by reference numeral 60, include a logical-to-physical module 62 which is typically implemented via software routines executed by control circuit 40. In particular, the conversion module is implemented through control routines which define particular pulse sequences in accordance with preestablished imaging protocols.

When called upon, code defining the conversion module references logical configuration sets 64 and physical configuration sets 65. The logical configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 62 serves to generate the pulse sequence for driving the coils of scanner 12 in accordance with constraints defined in these configuration sets. The conversion module will also serve to define adapted pulses for each physical axis to properly orient (e.g., rotate) slices and to encode gyromagnetic material in accordance with desired rotation or reorientation of the physical axes of the image.

Figure 3:
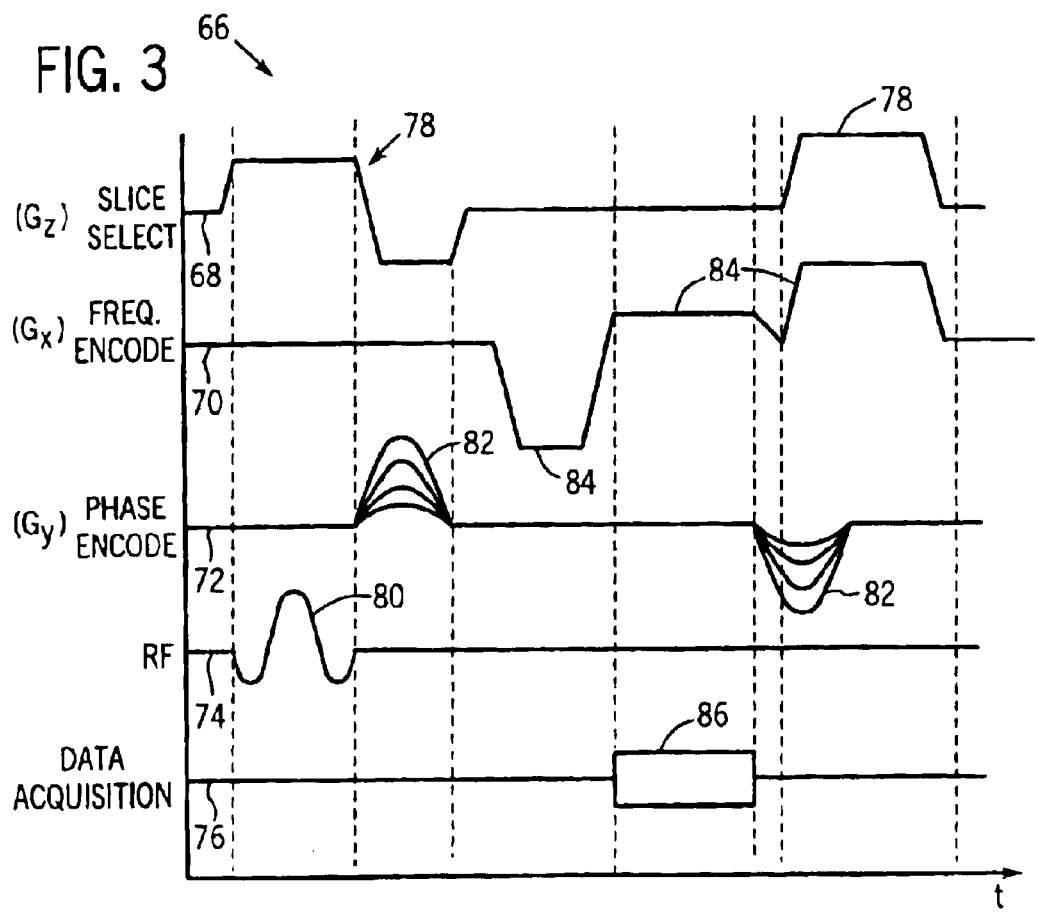
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a logical slice select axis 68, a frequency encoding axis 70, a phase encoding axis 72, an RF axis 74, and a data acquisition axis 76. In the pulse sequence illustrated in FIG. 3, the physical z-axis corresponds to the logical slice select axis 68; the physical x-axis corresponds to the logical frequency encoding axis 70; and the physical y-axis corresponds to the logical phase encoding axis 72. However, it should be understood that, for other pulse sequence descriptions and other types of examinations, the correspondence between physical and logical axes may differ.

In general, as shown in FIG. 3, the pulse sequence description begins with a pair of gradient pulses on slice select axis 68 as represented at reference numeral 78. During a first of these gradient pulses, an RF pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

To improve imaging performance, certain MRI systems include twin gradient coil sets: a whole body coil set and a supplemental coil set. The whole body coil set is similar to the coil set in conventional single gradient coil set systems and supports all conventional imaging applications. The supplemental coil set generally has a shorter geometry which enables generation of powerful gradient fields without producing unwanted peripheral nerve stimulation. The supplemental coil set generally is suitable for imaging most anatomical parts (e.g., head, spine, knee, abdomen) and has a fast slew rate which offers optimal breath-hold and ultra-fast imaging. In twin gradient coil systems, the two coil sets are driven at separate times. Thus, to perform an MR examination, a first scan in accordance with the pulse sequence description may be performed by driving the whole body coil set and then a second "fine tuning" scan in accordance with the pulse sequence description is performed by driving the supplemental coil set. In such systems, the control circuitry 14 generates a control signal to switch the gradient amplifiers between the whole body coil set and the supplemental coil set at the appropriate times during the MR examination.

Figure 4:
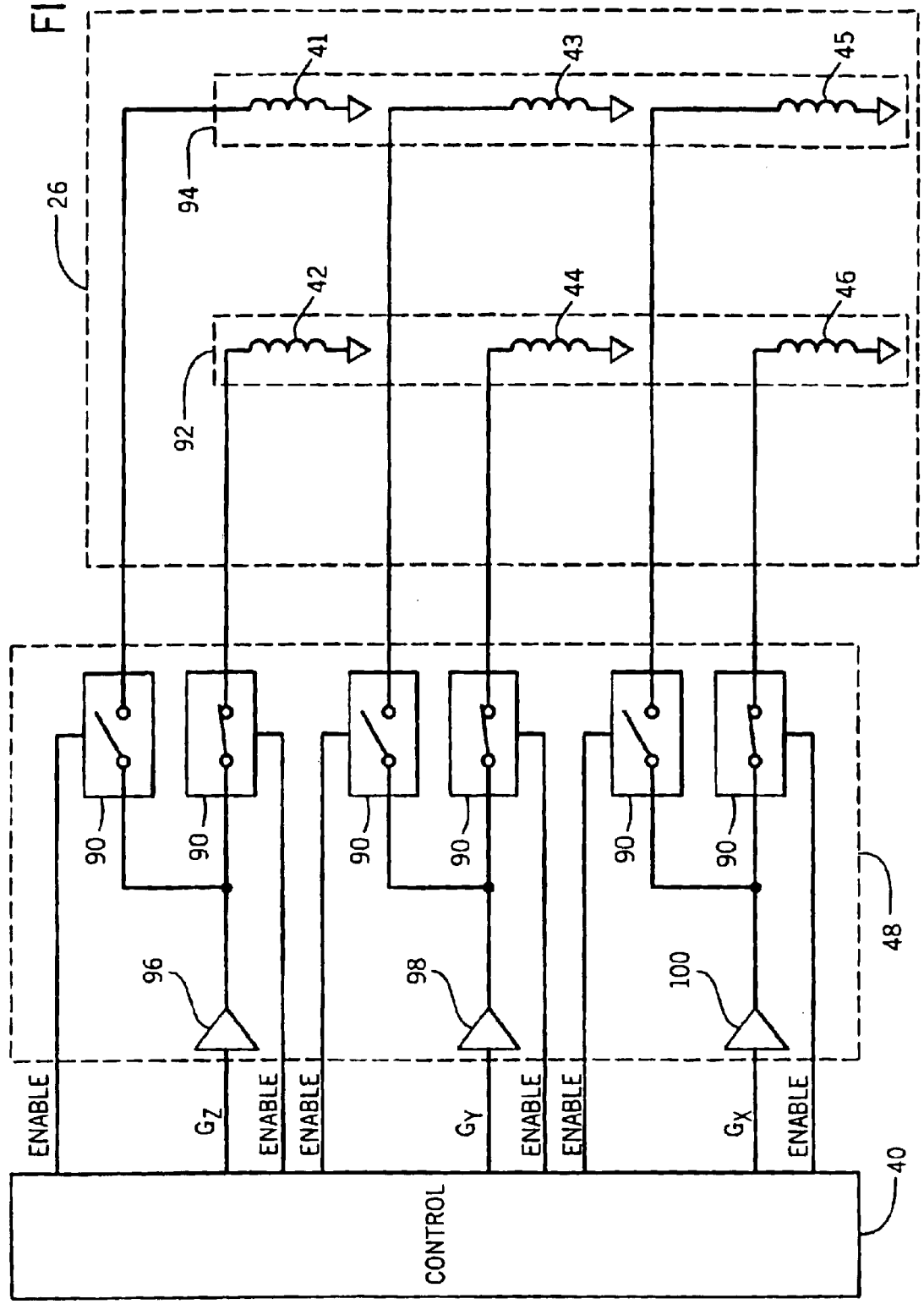
FIG. 4 is a diagrammatical representation of the gradient amplifier assembly, the switch assembly, and the gradient coil assembly of the system of FIG. 1, illustrating selective coupling of the gradient amplifiers to one set of twin gradient coil sets during an MRI examination.

One such configuration of the control circuitry is illustrated in FIG. 4. FIG. 4 is a schematic representation of a plurality of switching assemblies 90, which are incorporated in the gradient amplification and control circuitry 48 and controlled by control circuit 40 to selectively provide conductive paths for driving the gradient coils of either a first gradient coil set 92 (i.e., the whole body set) or a second gradient coil set 94 (i.e., the supplemental coil set) in accordance with a pulse sequence description, such as the pulse sequence 66 illustrated in FIG. 3.

As shown in FIG. 4, gradient amplification and control circuitry 48 includes an amplifier 96 to selectively drive either gradient coil 41 or 42, an amplifier 98 to selectively drive either gradient coil 43 or 44, and an amplifier 100 to selectively drive either gradient coil 45 or 46. Amplifiers 96, 98 and 100 receive as an input the pulse sequence description 66 as generated by control circuit 40. Amplifiers 96, 98, and 100 amplify the power of the gradient pulses of the pulse sequence description to an appropriate level for driving the gradient coils (e.g., approximately 100–300 amperes) For example, in the exemplary embodiment illustrated, amplifier 96 receives as an input the slice select gradient 78 (e.g. Gz) and amplifies the power of the gradient pulses to energize one of the z-axis gradient coils 41 or 42, as determined by the conductive states of the respective switch assemblies 90. Similarly, amplifier 98 receives the phase encoding gradient 82 (Gy), amplifies the power of the pulses, and energizes one of y-axis gradient coils 43 or 44, as determined by the conductive states of the respective switch assemblies 90. Amplifier 100 receives the frequency encoding gradient 70 (Gx) and amplifies the power of the pulses to energize either one of the x-axis gradient coils 45 or 46, as determined by the conductive states of the respective switch assemblies 90.

The conductive states of switch assemblies 90 are dependent on control signals received from control circuit 40. Thus, for example, control circuit 40 may provide a control signal which places the appropriate switch assemblies 90 in conductive states to perform a scan using the whole body coil set 92. Upon completion of the whole body coil set scan, control circuit 40 may provide a control signal which places the appropriate switch assemblies 90 in conductive states to perform a second scan using the supplemental coil set 94.

The control signals may be generated, for example, by a software control program stored in memory circuitry 50, by control circuit 40 in response to a command input by a user via interface 16.

Figure 5:
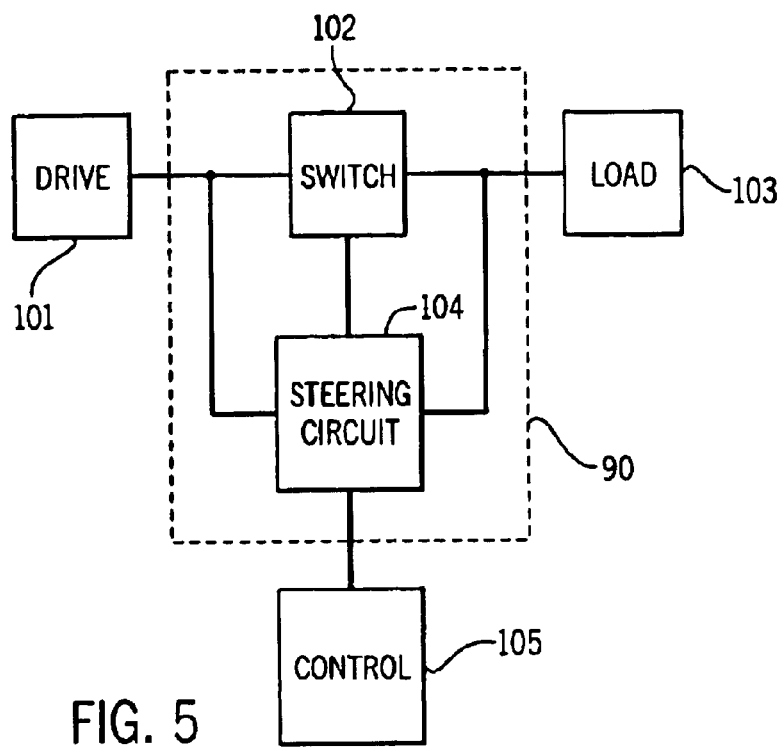
FIG. 5 is a diagrammatical representation of the switch assembly of FIG. 4, illustrating a switching device and a steering circuit.

Switching assemblies 90 may include a variety of types of electronic switching devices configured in a number of different topologies. A topology of an exemplary switching assembly 90 is illustrated diagrammatically in FIG. 5. Switching assembly 90 couples a drive 101 (e.g. amplifier 96) to a load 103 (e.g. gradient coil 42). The conductive state of the switching assembly 90 is controlled by a control circuit 105 (e.g. control circuit 40). Switching assembly 90 includes a switching device 102 which, when enabled by control circuit 40, transitions between conductive and nonconductive states to provide a current-carrying path between drive 101 and load 102. In the embodiment illustrated, switching assembly 90 also includes a steering circuit 104 to steer the current between the drive 101 and the load 103 in the event that switching device 102 cannot conduct current in a linear, or uninterrupted, manner. Thus, in applications in which linear conduction of current is a concern, steering circuit 104 ensures that a current-carrying path is provided between drive 101 and load 103 for the entire duration of any current flow, regardless of the magnitude of the current. The incorporation of the steering circuit 104 thus advantageously allows many different types of switching devices 102 to be used, such as transistors, diodes, etc.

For example, in one embodiment, switching device 102 is a thyristor (i.e., a silicon-controlled rectifier), which generally is not characterized by a linear conductive state. That is, the conductive state of a thyristor is dependent on the magnitude of the current flowing through the thyristor. Thus, even though the conductive state of the thyristor may be enabled (i.e. by application of an appropriate turn-on signal at the thyristor's gate), the thyristor may not conduct current if the amplitude of the current is below a minimum threshold value, $I_{hold}$. To maintain a conductive state, a thyristor which is capable of conducting currents of approximately 100–300 amperes typically requires a holding current greater than a threshold, $I_{hold}$, which is approximately 100–300 milliamperes. Thus, as the current transitions between positive and negative amplitudes or approaches near-zero values, the flow of current through switching device 102 may be interrupted.

In MR imaging systems, it is desirable to maintain linear conduction of gradient current between the gradient amplifiers and the gradient coils. Failure to drive the gradient coils in a manner that closely conforms to the pulse sequence description may result in poor imaging performance. The detrimental effects on imaging performance may be exhibited, for example, by loss of spatial resolution, geometric distortion in the acquired image, or images that cannot reliably be reproduced. Accordingly, in an MRI system, switching assembly 90 should be capable of linearly conducting gradient currents between positive and negative values and at near-zero values.

Figure 6:
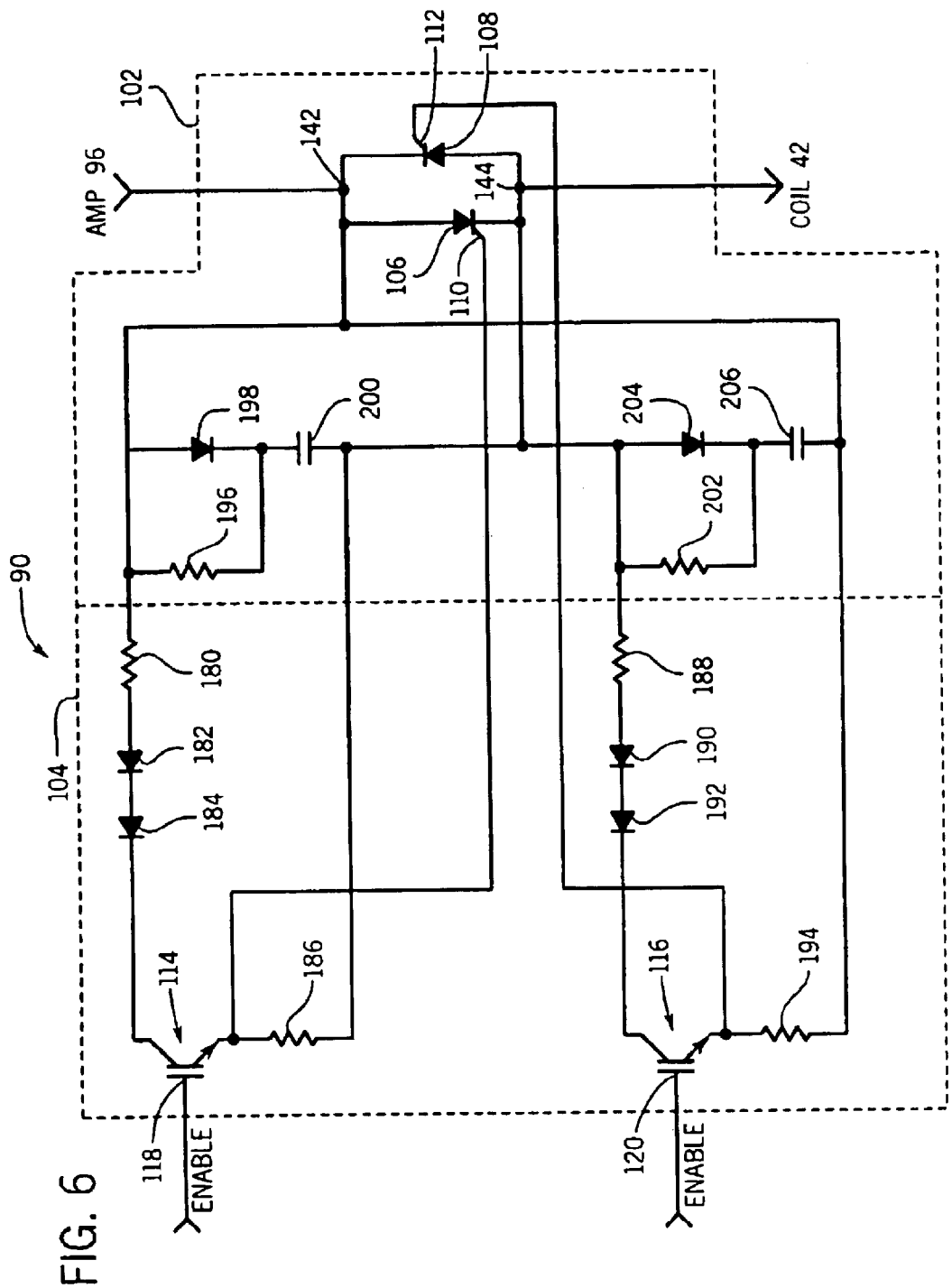
FIG. 6 is a schematical representation of an exemplary embodiment of the switch assembly of FIG. 5.

An exemplary embodiment of the invention in which linear current conduction is provided by switching assembly 90 is illustrated schematically in FIG. 6. Assembly 90 includes a switching device 102 which comprises a thyristor 106 coupled in antiparallel with a thyristor 108. For the specific MRI application illustrated, thyristors 106 and 108 are power components rated for 250 A, 1600V and are available in a single package (e.g., part number SKKT250/16E available from Semikron Intentional of Nurnberg, Germany). Thyristor 106 is configured to conduct the positive magnitude portions of the gradient current, while thyristor 108 is configured to conduct the negative magnitude portions of the gradient current between the gradient amplifier and the gradient coil. The conductive states of thyristors 106 and 108 are enabled by a turn-on signal applied to their respective gates 110 and 112, which is generated by control circuit 40. In the exemplary embodiment illustrated in FIG. 6, enable signals generated by control circuit 40 are applied to switching assembly 90, which may include appropriate electronic components to condition the enable signals for application to the various components in assembly 90.

For example, steering circuit 104 of switching assembly 90 includes a pair of insulated gate bipolar transistors 114 and 116 (e.g. part number IXBH9N160 available from IXYS Corp. of Santa Clara, Calif.), which are coupled to the gates 110 and 112 of thyristors 106 and 108, respectively. Application of conditioned enable signals generated by control circuit 40 to the gates 118 and 120 of transistors 114 and 116, respectively, of a level sufficient to forward bias the gate-emitter junctions of transistors 114 and 116 results in enablement of the conductive state of thyristors 106 and 108. Thus, for example, to couple gradient amplifier 96 to gradient coil 42, control circuit 40 generates an enable signal that is applied to gates 118 and 120 of transistors 114 and 116 of steering circuit 104 of the respective switching assembly 90. To decouple gradient amplifier 96 from gradient coil 42, the control circuit 40 removes the enable signal. Similarly, to couple gradient amplifier 96 to gradient coil 41 in the whole body coil set 92, control circuit 40 generates an enable signal which is applied to the appropriate switching assembly 90. Accordingly, once an enable signal is generated, thyristors 106 and 108 are in a state in which positive and negative current may be conducted between the gradient amplifier and the gradient coil.

Figure 7:
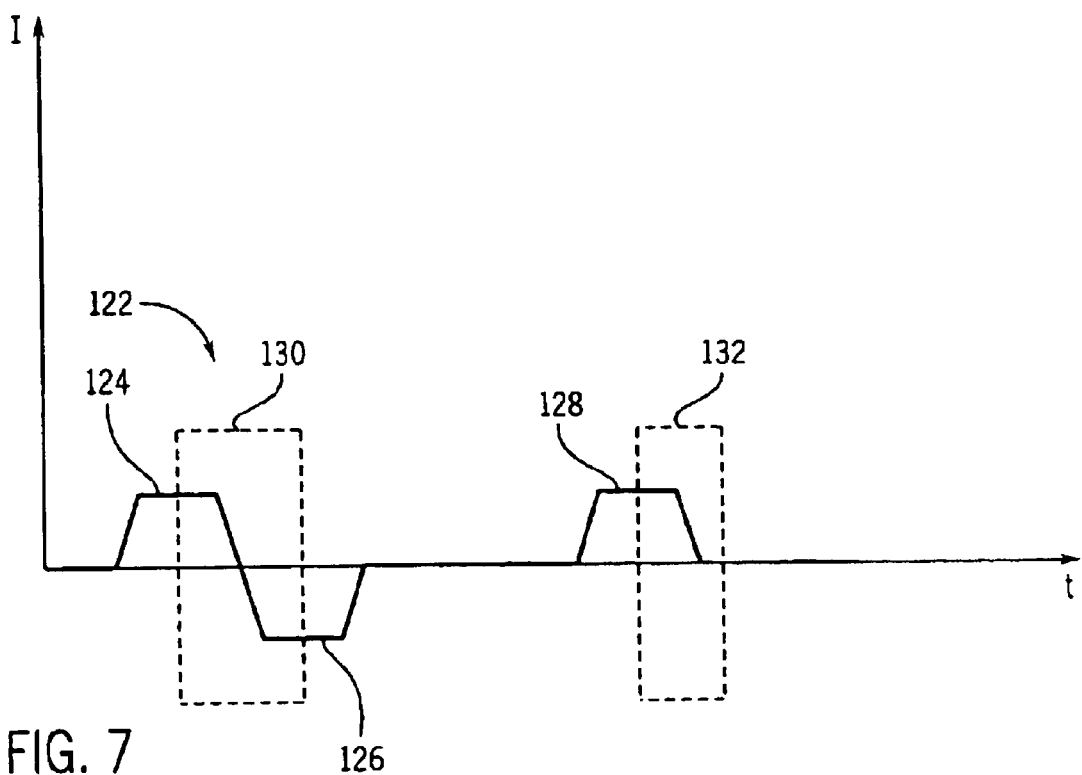
FIG. 7 is a graphical representation of the gradient current in the Z-axis gradient coil during the pulse sequence description of FIG. 2.

An exemplary waveform of the gradient current flowing between a gradient amplifier and a gradient coil is illustrated graphically in FIG. 7. In the graph of FIG. 7, the vertical axis is representative of the magnitude of current, and the horizontal axis is representative of time. The gradient coil waveform 122 illustrated in FIG. 7 corresponds to the slice select gradient 78 ($G_z$) shown in FIG. 3. Gradient current waveform 122 includes a first positive pulse 124 which transitions to a negative pulse 126. Current waveform 122 further includes a second positive pulse 128 which transitions between a substantially zero amplitude and a positive amplitude. Substantial portions of pulses 124 and 128 flow between the gradient amplifier and the gradient coil through thyristor 106. Similarly, a substantial portion of current pulse 126 flows between the gradient coil and the gradient amplifier through thyristor 108. A region 130, which is represented by dashed lines in FIG. 7, is representative of the region in which the gradient current transitions from a positive magnitude, through zero, to a negative amplitude. A region 132, represented by a second set of dashed lines in FIG. 7, illustrates the region in which current pulse 128 transitions from a positive magnitude to a near-zero value. The relationships between the current waveform 122 in regions 130 and 132 and other current and voltage signals in switch assembly 90 are illustrated in the graphs of FIGS. 8 and 9.

Referring now to FIG. 8, a graphical representation of the currents and voltages at various points in switching assembly 90 during portion 130 of current waveform 122 is illustrated. The vertical axis 134 in FIG. 8 is representative of the amplitude of either current or voltage, and the horizontal axis 136 is representative of time. The uppermost waveform 135 is representative of the current provided by the gradient amplifier 96. The gradient current transitions from a positive magnitude of approximately 250 amperes to a negative amplitude of approximately 250 amperes and passes through zero at the point generally referenced by the numeral 138. The points generally referenced by the numerals 150 and 151 indicate levels at which current 135 passes through the holding current threshold of the thyristors (e.g. 100–300 milliamperes).

The next waveform in FIG. 8, referenced generally by the numeral 140, is representative of the voltage at node 142 of the switching device 102 of FIG. 6 measured relative to the voltage at node 144. In the regions referenced generally by the numerals 146 and 148, the voltage level is representative of the voltage across a thyristor when the thyristor is conducting current (i.e. approximately 0.5–1.0 volts). In the regions referenced generally by the numerals 147 and 149, the voltage level is representative of the voltage needed to place steering circuit 104 in a conductive state (e.g. approximately 4 volts).

The next waveform, referenced generally by the numeral 152, is representative of the portions of gradient current 135 which flow through the switching device 102 of FIG. 6. A first portion 156 of waveform 152 is representative of the current flow through thyristor 106, and a second portion 158 of waveform 152 is representative of the current flow through thyristor 108.

The next waveform, referenced generally by the reference numeral 160, is representative of the current flow through steering circuit 104. A first portion 162 of this current flows through transistor 114 in the steering circuit 104 illustrated in FIG. 6, and a second portion 164 flows through transistor 116 of circuit 104.

The lowermost waveform, referenced generally by the numeral 166, is representative of the gradient current which energizes the gradient coil 42. Current waveform 166 substantially matches the current 135 provided by amplifier 96, and, thus, illustrates the linear conduction of current through the switching assembly 96. That is, substantially the entire gradient current generated by amplifier 96 is conducted between amplifier 96 and gradient coil 42.

FIG. 9 provides a graphical representation of the currents and voltages measured at the same points in switching assembly 90 as illustrated in FIG. 8. FIG. 9, however, illustrates these currents and voltages during portion 132 of the current waveform 122 illustrated in FIG. 7.

The uppermost waveform, referenced generally by the numeral 168, is representative of the current generated by amplifier 96. Current 168 transitions from a positive magnitude, through a threshold level 170 representative of the magnitude of the holding current of the thyristor, to a zero (or very low amplitude) value, which is referenced by the numeral 172.

The next waveform, referenced generally by the numeral 174, is representative of the voltage measured between nodes 142 and 144 of switching device 102 in FIG. 6. The portion of voltage waveform 174 referenced by the numeral 175 is representative of the voltage across thyristor 106 when thyristor 106 is in a conductive state. The portion of voltage waveform 174 referenced generally by the numeral 176 is representative of the voltage between nodes 142 and 144 when the steering circuit 104 is in a conductive state.

The next waveform, referenced generally by the numeral 177, is representative of the portion of the amplifier current 168 which flows through thyristor 106. The following waveform, referenced generally by the numeral 178, is representative of the portion of amplifier current 168 which is conducted through the steering circuit 104, and in particular through transistor 114.

Finally, the last waveform, referenced generally by the numeral 179, is representative of the gradient current in coil 42. Again, as a result of the combination of the steering circuit 104 with the switching device 102, substantially the entire gradient current generated by gradient amplifier 96, including the current generated during region 132, is conducted between amplifier 96 and gradient coil 42.

The linear conduction of gradient current between gradient amplifier 96 and gradient coil 42 illustrated in FIGS. 8 and 9 will now be explained with reference to the specific embodiment of switching assembly 90 in FIG. 6. As shown, steering circuit 104 includes a resistor 180 (e.g. 6.8 ohms, 2.5 W), diodes 182 and 184 (e.g. part number DSA1-18D available from IXYS Corp. of Santa Clara, Calif.), transistor 114, and a resistor 186 (e.g. 10 ohms, 2.5 W) which are coupled in series with each other. The series combination of these components is coupled in parallel with thyristor 106. Accordingly, depending on the conductive states of either thyristor 106 or transistor 114, a current-carrying path may be established between the gradient amplifier and the gradient coil. As stated above, transistor 114 is configured such that its gate 118 receives an enable signal from control circuit 40 which is sufficient to forward bias the gate-emitter junction of transistor 114 such that the gate 110 of thyristor 106, which is coupled to the emitter of transistor 114, is turned on. Thus, thyristor 106 can conduct current between amplifier 96 and coil 42 provided the magnitude of the gradient current is above the threshold holding current of the thyristor. Moreover, forward biasing of the gate-emitter junction of transistor 114 enables transistor 114 to assume a conductive state whenever the voltage at its collector is sufficiently high.

When thyristor 106 is enabled and in a conductive state, the voltage between nodes 142 and 144 is approximately 0.5 to 1.0 volts, which is insufficient to place transistor 114 in a conductive state. However, once the gradient current through thyristor 106 falls below the holding current threshold, thyristor 106 transitions to a non-conductive state, thus allowing the voltage between nodes 142 and 144 to rise. When the voltage between nodes 142 and 144 reaches a level sufficient to place transistor 114 in a conductive state, the gradient current is steered between the gradient amplifier and the gradient coil through transistor 114. In the specific embodiment illustrated in FIG. 6, this condition occurs when the voltage between nodes 142 and 144 is approximately 4 volts. It should be understood, however, that in other embodiments of the invention, this voltage level may be different and depends on the specific configuration and component values used in steering circuit 104, as would be readily appreciated by those of ordinary skill in the art.

Steering circuit 104 further includes a resistor 188 (e.g. 6.8 ohms, 2.5 W), diodes 190 and 192 (e.g. DSA1-18D), transistor 116, and a resistor 194 (e.g. 10 ohms, 2.5 W) coupled in series with each other. The series combination of these components is coupled in parallel with thyristor 108, such that, depending on the conductive state of either thyristor 108 or transistor 116, a current-carrying path may be established between the gradient amplifier and the gradient coil. As with transistor 114, transistor 116 is configured such that its gate 120 receives an enable signal from control circuit 40 which is sufficient to forward bias the gate-emitter junction of transistor 116 and turn on the gate 112 of thyristor 108. Accordingly, thyristor 108 is capable of conducting the gradient current so long as the enable signal is present at the gate 120 of transistor 116 and the amplitude of the gradient current is of a sufficient level (i.e. greater than the holding current of thyristor 108). When the amplitude of the gradient current is below the required holding current level, thyristor 108 can no longer maintain a conductive state. Accordingly, as thyristor 108 transitions to a non-conductive state, the voltage between nodes 144 and 142 will rise until it reaches a level sufficient to place transistor 116 in a conductive state (e.g. approximately 4 volts).

As illustrated in FIG. 6, switching device 90 also includes a resistor 196 (e.g. 2.2 kilohms, 2.5 W), a diode 198 (e.g. DSA1-18D, 1800V), and a capacitor 200 (e.g. 1 nanofarad, 2000V) coupled across thyristor 106 to snub any voltage spikes that may be generated when thyristor 106 transitions between conductive and non-conductive states. Similarly, switching assembly 90 includes a resistor 202 (e.g. 2.2 kilohms, 2.5 W), a diode 204 (e.g. DSA1-18D, 1800V), and a capacitor 206 (e.g. 1 nanofarad, 2000V) coupled across thyristor 108 to snub voltage spikes generated when thyristor 108 switches between conductive and non-conductive states.

It should be understood that the specific embodiment of switching device 90 illustrated in FIG. 6 is exemplary only and is not intended to limit the scope of the invention. As would be readily appreciated by those of skill in the art, the topology of the various components of switching device 90 can take many forms to provide substantially linear current flow. Further, switching device 90 may include various other components that perform additional functions. By way of example, switching device 90 may include various components to protect the gate-emitter junctions of transisters 114 and 116 and fuses to protect steering circuit 104 from overload conditions and single-fault conditions. Further, switching device 90 may include components which monitor the conductive states of thyristors 106 and 108 and report status and other diagnostic information to the control circuit 40.

Referring again to steering circuit 104, it should be appreciated that the magnitude of the current flowing through resistor 180, diode 182, diode 184, transistor 114, and resistor 186 is on the order of a few hundred milliamperes. Similarly, the current flow through resistor 188, diode 190, diode 192, transistor 116, and resistor 194, has a magnitude of only a few hundred milliamperes. Accordingly, because the power dissipated in steering circuit 104 is of a relatively low level, the specific components which comprise steering circuit 104 need not be power components. Thus, steering circuit 104 can easily be packaged in a compact area. Indeed, it is contemplated that steering circuit 104 and the snubber circuitry may be placed in the same physical package as the thyristors 106 and 108 such that switching assembly 90 can be used in any type of application in which the linear conduction of current is of concern.

It should be further understood that, although switching device 90 has been described in association with an MRI system, it is contemplated that switching device 90 can be used in any type of application in which the linear conduction of current, including current which transitions between positive and negative amplitudes and/or which has a near-zero amplitude, is desirable. Such applications include, but are not limited to, other types of medical imaging systems, electric motor drive systems, electrical systems for energizing lamps, and so forth.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging (MRI) system performing an MRI scan in accordance with a pulse sequence, the pulse sequence including at least a first pulse, the system comprising:

a gradient coil assembly generating a gradient magnetic field during the MRI scan;

an amplifier driving the gradient coil assembly such that the gradient coil assembly generates the gradient magnetic field in accordance with the pulse sequence; and a switch assembly providing a conductive path between the amplifier and the gradient coil assembly, the switch assembly comprising:

a first switching device having a conductive state during a first portion of the first pulse of the pulse sequence, the first portion dependent only on the magnitude of a current applied to the gradient coil assembly by the driving amplifier; and a second switching device coupled in parallel with the first switching device, the second switching device having a conductive state during a second portion of the first pulse of the pulse sequence during which the current from the amplifier to the gradient coil assembly is below a non-zero threshold value, wherein the conductive path is provided between the amplifier and the gradient coil assembly during substantially the entire duration of the first pulse.

2. The system as recited in claim 1, wherein the first portion of the first pulse of the pulse sequence is dependent on the magnitude of current conducted through the first switching device.

3. The system as recited in claim 2, wherein the second portion of the first pulse occurs when the magnitude of the current conducted through the first switching device reaches a non-zero threshold value.

4. The system as recited in claim 1, wherein the first switching device and the second switching device are unidirectional current-conducting devices, each of the first and second switching devices conducting current in the same direction between the amplifier and the gradient coil assembly.

5. The system as recited in claim 1, wherein the first switching device comprises a silicon controlled rectifier.

6. The system as recited in claim 5, wherein the second switching device comprises a transistor.

7. The system as recited in claim 1, the switching assembly comprising:

a third switching device coupled in parallel with the first switching device, the third switching device having a conductive state during a first portion of a second pulse of the pulse sequence, the second pulse having a polarity opposite of the first pulse; and a fourth switching device coupled in parallel with the third switching device, the second switching device having a conductive state during a second portion of the second pulse of the pulse sequence, such that the conductive path is provided between the amplifier and the gradient coil assembly during substantially the entire duration of the second pulse.

8. The system as recited in claim 1, wherein the gradient coil assembly comprises a first gradient coil set and a second gradient coil set, and the switch assembly selectively couples the amplifier to either the first gradient coil set or the second gradient coil set.

9. A magnetic resonance imaging (MRI) system acquiring MRI data, the system comprising:
- a processor controlling acquisition of the MRI data in accordance with a program stored in a memory, the program including an imaging protocol having a sequence of gradient pulses and a sequence of detection pulses;
- a gradient amplifier driving the gradient coil assembly in accordance with the sequence of gradient pulses;
- an MRI scanner performing an MRI scan, in accordance with the stored imaging protocol, the MRI scanner comprising a magnet, a gradient coil assembly, and an RF coil assembly, the gradient coil assembly generating a gradient magnetic field in accordance with the sequence of pulses;
- a switch assembly coupled between the gradient amplifier and the gradient coil assembly providing a conductive path therebetween, the switch assembly comprising:
    - a first switching device having a conductive state during a first portion of the first pulse of the pulse sequence, the first portion dependent only on the magnitude of a current applied to the gradient coil assembly by the driving amplifier; and
    - a second switching device coupled in parallel with the first switching device, the second switching device having a conductive state during a second portion of the first pulse of the pulse sequence during which the current from the amplifier to the gradient coil assembly is below a non-zero threshold value,
- wherein the conductive path is provided between the amplifier and the gradient coil assembly during substantially the entire duration of the first pulse; and
- an RF detector coupled to the RF coil to detect MRI data resulting from the MRI scan in accordance with the sequence of detection pulses.

10. The system as recited in claim 9, wherein the first switching device comprises a silicon controlled rectifier.

11. The system as recited in claim 9, wherein the switch assembly comprises:
- a third switching device coupled in anti-parallel with the first switching device, the third switching device having a conductive state during a first portion of a second gradient pulse, the second gradient pulse having a polarity opposite the first gradient pulse; and
- a fourth switching device coupled in parallel with the third switching device, the fourth switching device having a conductive state during a second portion of the second gradient pulse, such that the conductive path is provided between the gradient amplifier and the gradient coil assembly during substantially the entire duration of the second pulse.

12. The system as recited in claim 11, wherein the first switch device and the third switching device each comprises a silicon controlled rectifier.

13. The system as recited in claim 9, wherein the gradient coil assembly comprises a first gradient coil set and a second gradient coil set, and the switch assembly selectively couples the gradient amplifier to either the first gradient coil set or the second gradient coil set.

14. A method for performing a magnetic resonance imaging (MRI) scan with an MRI system including a gradient coil assembly, the MRI scan being performed in accordance with a pulse sequence, the method comprising:
- receiving a pulse sequence;
- generating a current to drive the gradient coil assembly in accordance with the pulse sequence, the current comprising a plurality of current pulses;
- conducting the current to the gradient coil assembly through a switch assembly, the switch assembly comprising a first switching device and a second switching device coupled in parallel with the first switching device;
- placing the first switching device in a conductive state during a first portion of a first current pulse, the conductive state of the first switching device dependent only on the magnitude of the current applied to the gradient coil assembly during the first current pulse by a driving amplifier; and
- placing the second witching device in a conductive state during a second portion of the first current pulse, such that the current is conducted to the gradient coil assembly during substantially the entire duration of the first current pulse wherein placing the second switching device in the conductive state occurs when the absolute value of the magnitude of the current applied to the gradient coil assembly is below a non-zero threshold value.

15. The method as recited in claim 14, wherein placing the second switching device in the conductive state occurs when the first switching device transitions to a non-conductive state.

16. The method as recited in claim 14, wherein the switch assembly comprises a third switching device coupled in anti-parallel with the first switching device, and a fourth switching device coupled in parallel with the third switching device, and the method comprises:
- placing the third switching device in a conductive state during a first portion of a second current pulse, the second current pulse having a polarity opposite the first current pulse, the conductive state of the third switching device being dependent on the magnitude of the current during the second current pulse; and
- placing the fourth switching device in a conductive state during a second portion of the second current pulse, such that the current is conducted to the gradient coil assembly during substantially the entire duration of the second current pulse.

17. The method as recited in claim 14, wherein the gradient coil assembly comprises a first set of gradient coils and a second set of gradient coils, and the method comprises:
- coupling the switch assembly to the first set of gradient coils;
- conducting the current to the first set of gradient coils during the first pulse sequence;
- coupling the switch assembly to the second set of gradient coils; and
- conducting the current to the second set of gradient coils during a second pulse sequence.

18. The method as recited in claim 14, comprising:
generating MRI data as a result of the MRI scan; and
detecting the MRI data.

* * * * *